(12) United States Patent
Chen et al.

(10) Patent No.: US 10,551,649 B2
(45) Date of Patent: Feb. 4, 2020

(54) DISPLAY PANEL, CONTROLLING METHOD THEREOF AND WINDOW COMPRISING THE SAME

(71) Applicants: BOE TECHNOLOGY GROUP CO., LTD., Beijing (CN); Chengdu BOE Optoelectronics Technology Co., Ltd., Sichuan Province (CN)

(72) Inventors: Wenqiang Chen, Beijing (CN); Wei He, Beijing (CN); Jiao Fang, Beijing (CN); Shi Cheng, Beijing (CN); Lixia Huang, Beijing (CN); Jian Yang, Beijing (CN); Qing Chang, Beijing (CN); Xinghua Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 11 days.

(21) Appl. No.: 15/921,751

(22) Filed: Mar. 15, 2018

(65) Prior Publication Data

US 2019/0011748 A1 Jan. 10, 2019

(30) Foreign Application Priority Data

Jul. 5, 2017 (CN) .......................... 2017 1 0541957

(51) Int. Cl.
*G02F 1/133* (2006.01)
*H01L 31/04* (2014.01)

(52) U.S. Cl.
CPC .......... *G02F 1/13318* (2013.01); *H01L 31/04* (2013.01); *G02F 2001/13324* (2013.01); *G09G 2310/0264* (2013.01)

(58) Field of Classification Search
CPC ... H01L 31/04; E06B 9/00; B81C 1/00; G02F 1/13318
See application file for complete search history.

(56) References Cited

U.S. PATENT DOCUMENTS

2005/0248531 A1* 11/2005 Tanaka .................. G06F 3/0386
345/156
2013/0334436 A1* 12/2013 Yamada .................. H04N 5/32
250/394

(Continued)

FOREIGN PATENT DOCUMENTS

| CN | 1446322 A | 10/2003 |
|---|---|---|
| CN | 102810551 A | 12/2012 |

(Continued)

OTHER PUBLICATIONS

First Office Action for Chinese Patent Application No. 201710541957.0 dated Sep. 5, 2019.

*Primary Examiner* — Abbas I Abdulselam
(74) *Attorney, Agent, or Firm* — Calfee, Halter & Griswold LLP

(57) ABSTRACT

A display panel includes an array substrate, and a plurality of display units disposed on the array substrate each of which includes a display sub-pixel for receiving sunlight radiation and performing display, a solar cell disposed adjacent to the display sub-pixel and configured to receive sunlight radiation and perform photoelectric transformation, a micro-electromechanical optical valve disposed above and movable over the display sub-pixel and the solar cell to control a light transmittance of the display sub-pixel, and a blocking structure disposed at an edge of the display unit to limit the movement of the micro-electromechanical optical valve within the display unit.

20 Claims, 4 Drawing Sheets

(56) References Cited

U.S. PATENT DOCUMENTS

| | | | | |
|---|---|---|---|---|
| 2015/0350583 A1* | 12/2015 | Mauritzson | ............ | H04N 5/378 250/208.1 |
| 2016/0127629 A1* | 5/2016 | Sun | ...................... | H04N 5/2351 348/362 |
| 2016/0261728 A1* | 9/2016 | Kim | .................. | H04M 1/72577 |
| 2016/0276590 A1* | 9/2016 | Kim | ....................... | B01J 20/226 |

FOREIGN PATENT DOCUMENTS

| | | |
|---|---|---|
| CN | 102947874 A | 2/2013 |
| CN | 103513418 A | 1/2014 |
| CN | 103728753 A | 4/2014 |
| CN | 105761629 A | 7/2016 |
| JP | 2002040336 A | 2/2002 |

\* cited by examiner

DISPLAY PANEL, CONTROLLING METHOD THEREOF AND WINDOW COMPRISING THE SAME

CROSS REFERENCE

The present application claims the priority of Chinese Patent Application No. 201710541957.0, filed on Jul. 5, 2017, entitled "Display panel, controlling method thereof and window comprising the same" and the entire contents thereof are incorporated herein by reference as part of the present application.

TECHNICAL FIELD

The present disclosure relates to the technical field of display device, and in particular, to a display panel, a controlling method thereof and a window comprising the same.

BACKGROUND

In currently used liquid crystal screens, liquid crystal materials are needed for all displays, resulting in a problem of such as safety and waste of material. Under the state that currently conventional energy is being depleted, the solar energy has been greatly developed as a new type of energy, of which the solar cell is mostly used. The solar cell is a device which directly transforms the optical energy into electrical energy through photoelectrical effect or photochemical effect, and makes an important contribution to solution of the current problem of lacking energy.

The liquid crystal display devices in the prior art all use external electricity to drive the display panels to display images, which, in addition to huge pollution to the environment due to use of liquid crystal materials, has a large consumption of energy. Therefore, there is an urgent need to develop a display device which can use clean solar energy to drive display, can perform display without use of liquid crystal materials, and save conventional energy.

SUMMARY

In an embodiment of the disclosure there is provided a display panel comprising an array substrate, and a plurality of display units disposed on the array substrate each of which comprises a display sub-pixel for receiving sunlight radiation and performing display, a solar cell disposed adjacent to the display sub-pixel and configured to receive sunlight radiation and perform photoelectric transformation, a micro-electromechanical optical valve disposed above and movable over the display sub-pixel and the solar cell to control a light transmittance of the display sub-pixel, and a blocking structure disposed at an edge of the display unit to limit the movement of the micro-electromechanical optical valve within the display unit.

In an exemplary embodiment, the micro-electromechanical optical valve is connected with the array substrate which controls the movement of the micro-electromechanical optical valve over the display sub-pixel and the solar cell.

In an exemplary embodiment, when the micro-electromechanical optical valve is moved over the display sub-pixel and the solar cell to expose the solar cell, the solar cell receives sunlight radiation to perform photoelectric transformation.

In an exemplary embodiment, the array substrate is connected with the solar cell, and is driven by electric energy obtained through photoelectric transformation from the sunlight received by the solar cell.

In an exemplary embodiment, the solar cell comprises a PN junction.

In an exemplary embodiment, the display sub-pixels comprise one or more of red pixels, blue pixels or green pixels.

In an exemplary embodiment, the micro-electromechanical optical valve and the solar cell comprise an opaque material.

In an exemplary embodiment, the micro-electromechanical optical valve has an area equal to or greater than that of the display sub-pixel.

In an exemplary embodiment, the micro-electromechanical optical valve has an area equal to or less than that of the solar cell.

In an exemplary embodiment, areas of the micro-electromechanical optical valve, the display sub-pixel and the solar cell are equal to each other.

In an embodiment of the disclosure, there is also provided a controlling method for controlling the aforesaid display panel, the controlling method comprising: controlling movement of the micro-electromechanical optical valve of each of the display units over the solar cell and the display sub-pixel to control the light transmittance of the display sub-pixel receiving sunlight radiation to perform display, wherein the blocking structure limits the movement of the micro-electromechanical optical valve within the display unit.

In an exemplary embodiment, the array substrate is used to control the movement of the micro-electromechanical optical valve over the display sub-pixel and the solar cell.

In an exemplary embodiment, when the micro-electromechanical optical valve is moved over the display sub-pixel and the solar cell to expose the solar cell, the solar cell receives sunlight radiation to perform photoelectric transformation.

In an exemplary embodiment, the array substrate is driven by electric energy obtained through photoelectric transformation from the sunlight received by the solar cell.

The present disclosure further provides a window comprising the aforesaid display panel.

DETAILED DESCRIPTION

Hereinafter, the disclosure will be further described in detail with reference to the accompanying drawings and embodiments. It should be understood that the described embodiments are only for explaining, but not limiting, the present disclosure. Also, it should be noted that only portions relevant to the disclosure, rather than the whole structure, are shown in the accompanying drawings.

In the embodiment there is provided a display panel. FIGS. 1-4 show schematic structural views of the display panel according to the embodiment of the disclosure in displaying state.

Figure 1:
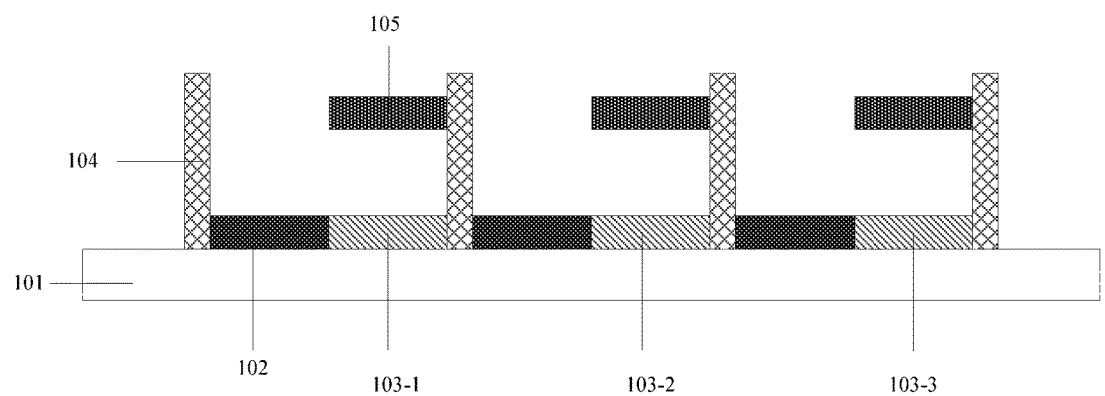
FIGS. 1-4 show schematic structural views of a display panel according to an embodiment of the disclosure.

As shown in FIG. 1, the display panel comprises an array substrate 101 and a plurality of display units disposed on the array substrate 101. Each of the display units comprises a display sub-pixel 103-1, 103-2 or 103-3. For example, the display sub-pixel 103-1 is a red pixel, the display sub-pixel 103-2 is a blue pixel, and the display sub-pixel 103-3 is a green pixel. The embodiment, however, is not limited thereto. Different display sub-pixels of different colors show different colors when receiving sunlight radiation.

Each of the display units further comprises a solar cell 102 which is disposed adjacent to the display sub-pixel 103-1. The solar cell 102 includes a PN junction, and may be an organic or inorganic solar cell. Here, the solar cell has an opaque material quality. Each of the display units further includes a micro-electromechanical optical valve 105 and a blocking structure 104. The micro-electromechanical optical valve 105 is disposed and movable over the display sub-pixel 103-1 and the photoelectric transformer (that is, the solar cell) 102 to control receipt of light radiation by the display sub-pixel and the solar cell.

The micro-electromechanical optical valve 105 can adjust light transmittance of the display sub-pixel 103-1 by blocking light. When the micro-electromechanical optical valve 105 is positioned above and completely covers the display sub-pixel 103-1, the display sub-pixel 103-1 cannot receive light radiation, i.e., the display sub-pixel 103-1 is in a state of completely not allowing light to transmit and does not perform display, in which case the solar cell 102 is exposed to and can receive the sunlight radiation, and can be charged. Such a state is shown in FIG. 1.

Figure 2:
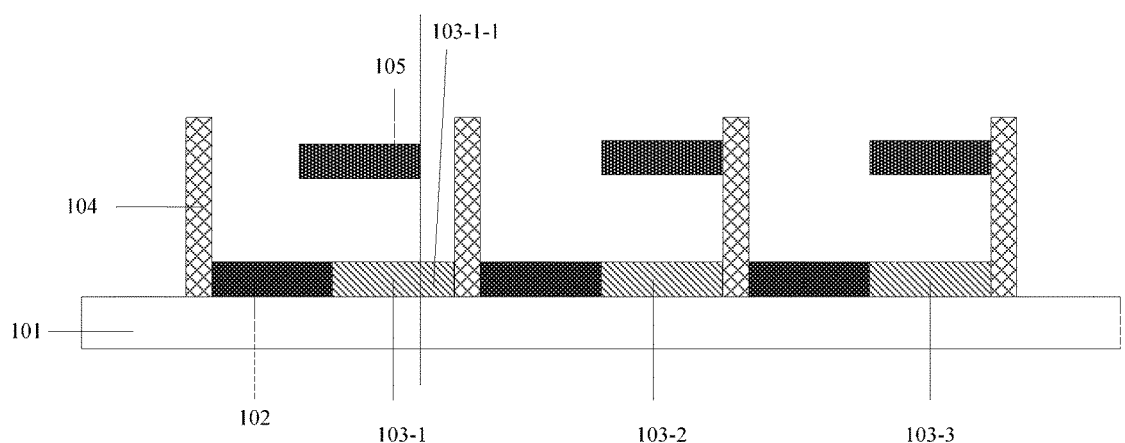

The micro-electromechanical optical valve 105 is movable over the display sub-pixel 103-1 and the solar cell 102. When the micro-electromechanical optical valve 105 is moved towards the positon above the solar cell 102, as shown in FIG. 2, a portion 103-1-1 of the display sub-pixel 103-1 may be exposed, in which case the exposed portion 103-1-1 may receive the sunlight radiation such that the light transmits through the portion of the display sub-pixel 103-1-1, and display is performed. However, the portion of the display sub-pixel 103-1-1 has a small area and receives a small amount of sunlight radiation, and the light transmittance of the display sub-pixel is not high. At the present time, a portion of the solar cell 102 may receive the sunlight radiation to perform photoelectric transformation and charge the display panel.

Figure 3:
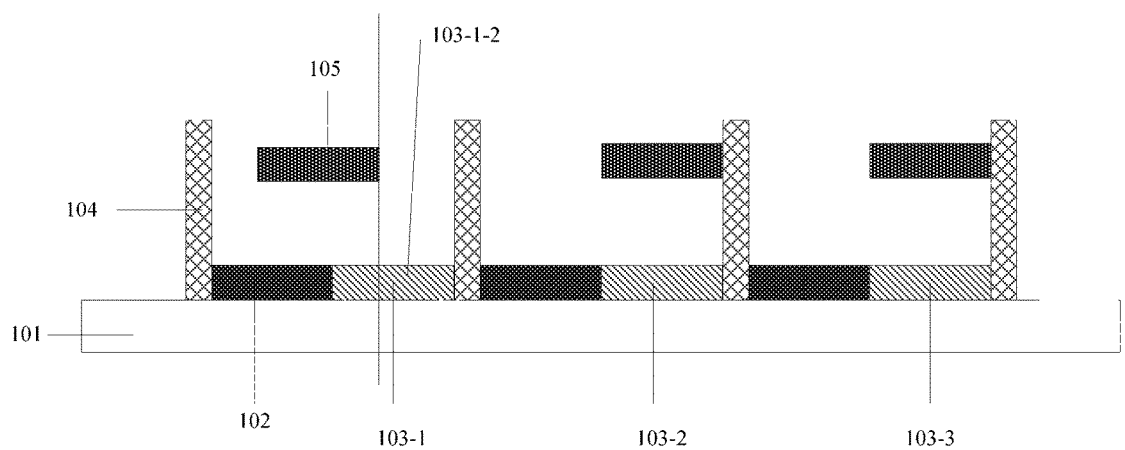

When the micro-electromechanical optical valve 105 continues moving towards the positon above the solar cell 102, as shown in FIG. 3, a portion 103-1-2 of the display sub-pixel 103-1 may be exposed, in which case the area of the exposed portion of the display sub-pixel 103-1 is increased. Increased area of the exposed portion 103-1-2 as compared with that of the exposed portion 103-1-1 indicates that the display sub-pixel 103-1 can receive more sunlight radiation and the light transmittance of the display sub-pixel is improved.

Accordingly, the light transmittance of the display sub-pixel is controlled by the micro-electromechanical optical valve 105 in such a way that the micro-electromechanical optical valve 105 is moved over the display sub-pixel 103-1 and the solar cell 102, thereby the display sub-pixel is controlled to display an image. The display mode of the display panel according to the present disclosure may be transmissive display or reflective display, that can be common knowledge to those skilled in the art.

The blocking structure 104 is disposed at an edge of each display unit to limit the movement of the micro-electromechanical optical valve 105 within each display unit, such that the light transmittance of the plurality of display units may be separately controlled to make the display panel display an image as desired.

Figure 4:
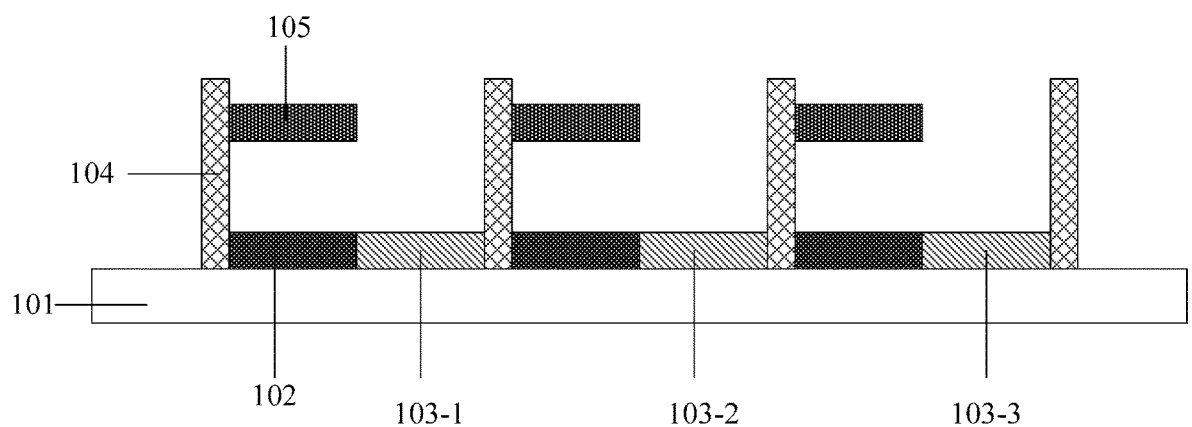

As shown in FIG. 4, when the micro-electromechanical optical valve 105 is completely moved above the solar cell 102 and completely covers the solar cell 102, the display sub-pixel 103-1 has a maximum light transmittance, while the solar cell 102 cannot receive the sunlight radiation and cannot be charged. In such a case, the display sub-pixel 103-1 can receive the most amount of the sunlight radiation for display.

Accordingly, in the embodiment, the light transmittance of the display sub-pixel is controlled in the aforesaid way that the micro-electromechanical optical valve 105 is controlled to move over the display sub-pixel and the solar cell. The display mode implemented by the micro-electromechanical optical valve 105 is a MEMS (Micro Electro Mechanical System) display technology, which can be common knowledge to those skilled in the art. According to the MEMS display technology, the movement of the micro-electromechanical optical valve 105 is controlled based on the data signals of each of the display sub-pixels on the array substrate 101, so that the display panel can display an image. The MEMS display technology is not described here. The display panel according to the embodiment includes a plurality of display units, the transmission of the display sub-pixel of each of the display units is controlled on demand, and thus the display panel as a whole is controlled to display an image as desired. At the same time in the case where the display sub-pixel does not have to have a very high light transmittance or does not perform display, the solar cells 102 may be exposed to the radiation from the sunlight source to transform the received light to electric energy and charge the display panel.

In an embodiment, the micro-electromechanical optical valve 105 may be made from an opaque material. When the micro-electromechanical optical valves 105 of all or most of the display units are moved above the display sub-pixels 103-1 to completely cover the display sub-pixels 103-1, with the display units being in the charging state, the display panel as a whole is the state of not allowing light to transmit since both the solar cells 102 and the micro-electromechanical optical valves 105 are of opaque material quality. Such a display panel may be used as a window serving to not allow light to transmit. At the same time when the solar cells 102 serve to not allow light to transmit, the solar cells 102 receives and transforms solar energy into electric energy to charge the display panel, thereby serving to save energy.

In the embodiment as shown in FIGS. 1 and 2, areas of the micro-electromechanical optical valve 105, the display sub-pixel 103-1 and the solar cell 102 are equal to each other, which is merely an example capable of optimizing the configuration of the display panel, but is not intended to limit the disclosure. The configuration that areas of the micro-electromechanical optical valve, the display sub-pixel and the solar cell in each of the display units are equal to each other has an advantage in that when charging is performed, the micro-electromechanical optical valve can cover the area of the display sub-pixel such that the display panel does not allow light to transmit, while the solar cell can be completely exposed to the light radiation to maximize the charging efficiency, and that when display is performed, the micro-electromechanical optical valve can cover the solar cell such that the display sub-pixel is completely exposed to the light radiation to make a full display.

In an embodiment, micro-electromechanical optical valves 105 are connected with the array substrate 101. The movement of the micro-electromechanical optical valves 105 is controlled by transistors on the array substrate 101, and in turn the light transmittance of the display sub-pixels is controlled, thereby achieving a rapid change of the light transmittance of the display sub-pixels and an improvement of image quality.

In an embodiment, the array substrate is connected with the solar cells. The array substrate may be driven by electric energy obtained through photoelectric transformation from the sunlight received by the solar cells, thereby saving energy.

Figure 5:
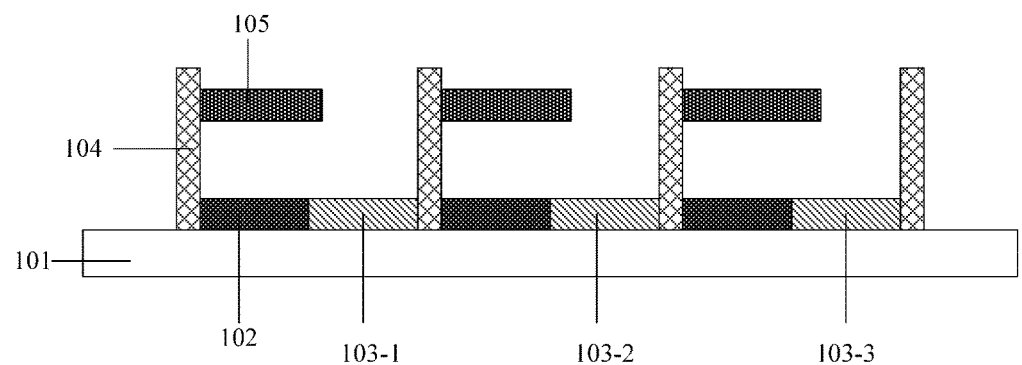
FIGS. 5-6 show schematic structural views of a display panel according to another embodiment of the disclosure.
Figure 6:
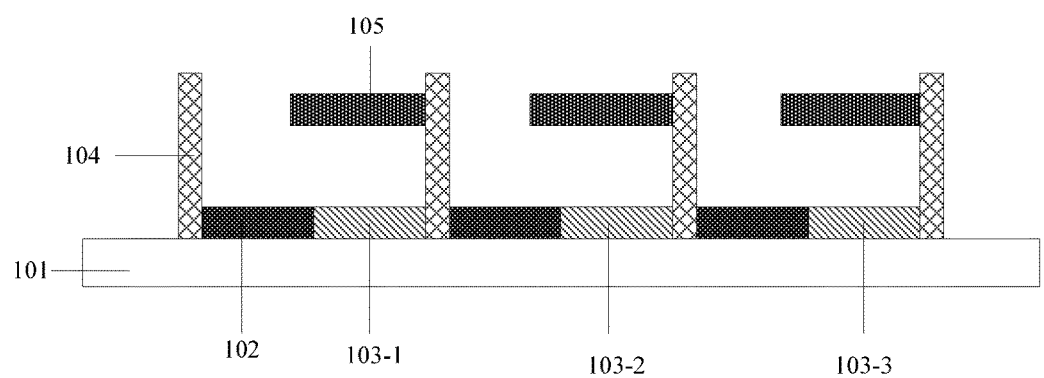

In another embodiment of the present disclosure, there is provided another display panel. FIGS. 5 and 6 show schematic structural views of the display panel according to another embodiment of the disclosure.

The display panel according to this embodiment differs from the display panel according to the first embodiment in that the area of the micro-electromechanical optical valve 105 is greater than that of the display sub-pixel 103-1, for the purpose of ensuring the light-blocking effect of the display panel.

As shown in FIG. 5, in the displaying state, the micro-electromechanical optical valve 105 in the display unit is positioned above the solar cell 102 such that the display sub-pixel 103-1 is exposed to the light radiation for performing display.

As shown in FIG. 6, in the charging state, the micro-electromechanical optical valve 105 in the display unit is positioned above the display sub-pixel 103-1 such that the solar cell 102 is exposed to the light radiation for being charged. Since the area of the micro-electromechanical optical valve 105 is greater than that of the display sub-pixel 103-1 covered by it, in the case where both the micro-electromechanical optical valve 105 and the solar cell 102 are of opaque material, the micro-electromechanical optical valve 105 can cover the display sub-pixel 103-1 more effectively, preventing light from entering in later directions, such that the display panel has a better effect of not allowing light to transmit, and has a better usage effect when being used as a window.

In the embodiment as shown in FIGS. 5 and 6, the areas of the display sub-pixel 103-1 and the solar cell 102 are equal to each other, which is merely an example and not intended to limit the disclosure.

Figure 7:
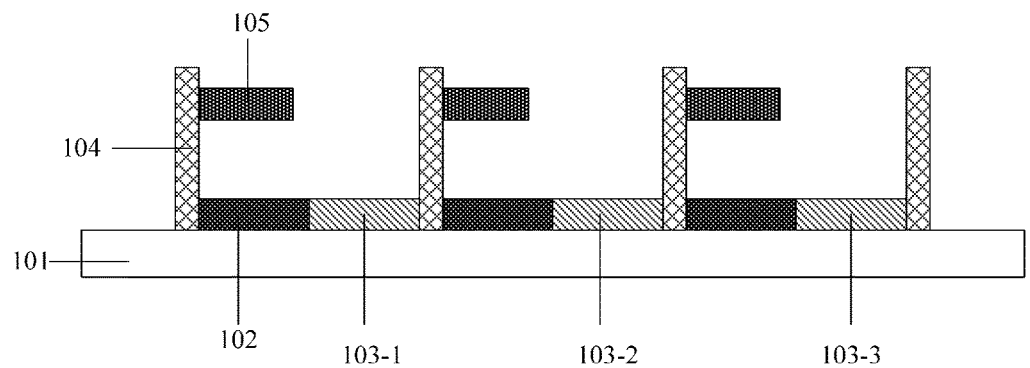
FIGS. 7-8 show schematic structural views of a display panel according to yet another embodiment of the disclosure.
Figure 8:
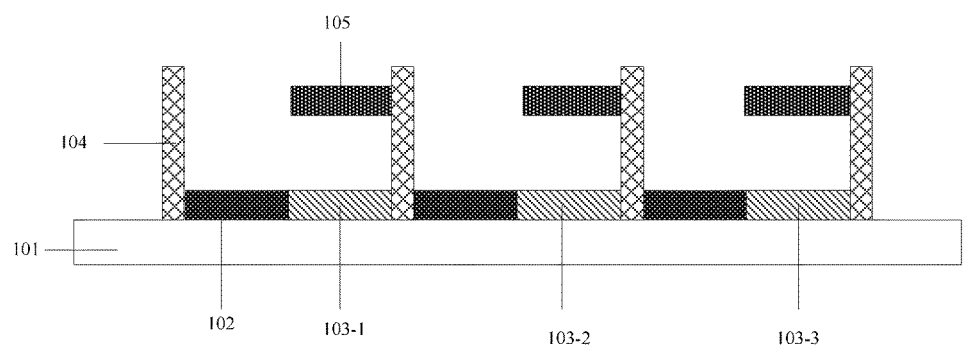

In yet another embodiment of the present disclosure, there is provided another display panel. FIG. 7 shows a schematic structural view of the display panel according to yet another embodiment of the disclosure which is in the displaying state. FIG. 8 shows the display panel according to the embodiment of the disclosure in the charging state.

The display panel according to this embodiment differs from the display panel according to the first embodiment in that the area of the micro-electromechanical optical valve 105 is less than that of the solar cell 102, for the purpose of ensuring a maximum light transmittance for the display sub-pixel and the displaying effect.

As shown in FIG. 7, when display is performed, the micro-electromechanical optical valve 105 in the display unit is positioned above the solar cell 102 such that the display sub-pixel 103-1 is exposed to the light radiation for display. In such a case, since the area of the micro-electromechanical optical valve 105 is less than that of the solar cell 102, it can be assured that the display sub-pixel 103-1 adjacent to the solar cell 102 is fully exposed to the light radiation, and that the display sub-pixel can have a maximum light transmittance when needed and exhibit a better displaying effect.

As shown in FIG. 8, in the charging state, the micro-electromechanical optical valve 105 in the display unit is positioned above the display sub-pixel 103-1 such that the solar cell 102 is exposed to the light radiation for being charged.

In the embodiment as shown in FIGS. 7 and 8, the areas of the display sub-pixel 103-1 and the solar cell 102 are equal to each other, which is merely an example and not intended to limit the disclosure.

Figure 9:
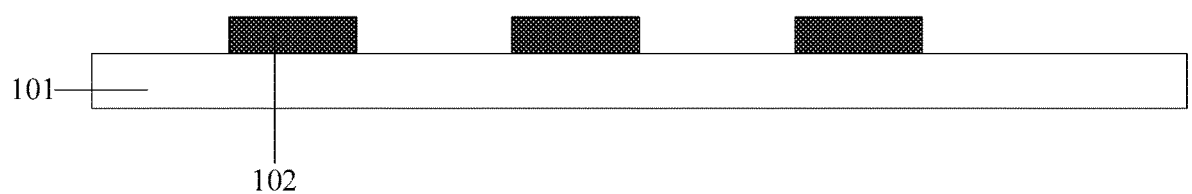
FIGS. 9-11 show a process flow chart for fabricating a display panel according to the disclosure.
Figure 10:
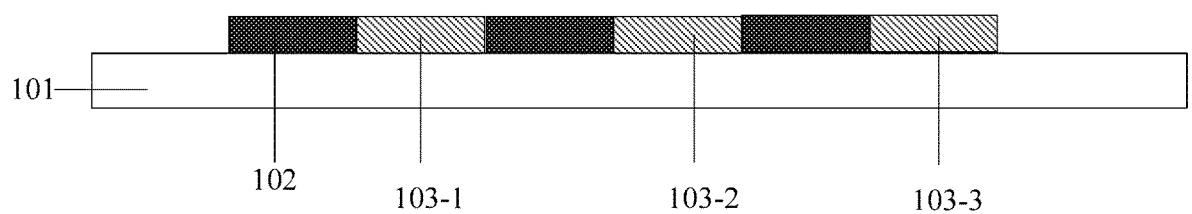

In the embodiment there is provided a method for fabricating the display panel according to the disclosure. FIGS. 9 and 10 show the process flow chart for fabricating the display panel according to the disclosure.

The method for fabricating the display panel includes the steps as follows.

As shown in FIG. 9, firstly, solar cells 102 are fabricated on a substrate 101, wherein the solar cells may be organic or inorganic solar cells, and wherein the solar cells include an opaque material in the case where the display panel is used as a window.

As shown in FIG. 10, then display sub-pixels 103-1, 103-2 and 103-3 are formed on the substrate 101 by lithographic technique, each of the display sub-pixels being adjacent to one solar cell, respectively.

Each display sub-pixel, together with its adjacent solar cell, forms a display unit.

Figure 11:
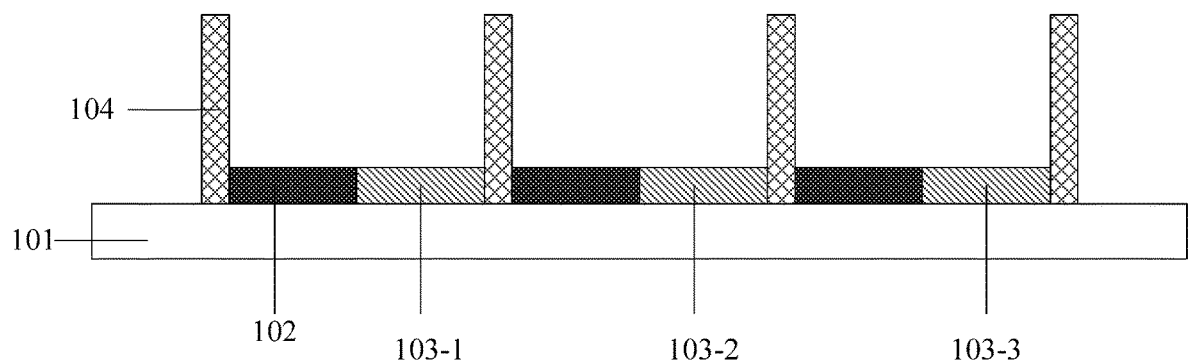

As shown in FIG. 11, then a blocking structure 104 is disposed at an edge of each display unit.

Finally, micro-electromechanical optical valves 105 are formed above the display sub-pixels and the solar cells, and the display panel as shown in FIG. 1 is obtained.

In yet another embodiment there is provided a controlling method for controlling the display panels according to the above described embodiments.

The controlling method includes controlling movement of the micro-electromechanical optical valve 105 of each of the display units over the solar cell 102 and the display sub-pixel 103-1, 103-2 or 103-3, the blocking structures limiting the movement of the micro-electromechanical optical valves 105 within the display units, to achieve a separate control for each of the display units.

In each of the display units, the controlling method controls the movement of the micro-electromechanical optical vale 105 over the solar cell 102 and the display sub-pixel 103-1. When the micro-electromechanical optical valve 105 is moved from above the display sub-pixel 103-1 towards above the solar cell 102, the amount of sunlight radiation received by the display sub-pixel is increased as the area of the micro-electromechanical optical valve 105 covering the display sub-pixel 103-1 is decreased, indicating that the light transmittance of the display sub-pixel is improved.

When the micro-electromechanical optical valve 105 is moved from above the solar cell 102 towards above the display sub-pixel 103-1, the amount of sunlight radiation received by the display sub-pixel is decreased as the area of the micro-electromechanical optical valve 105 covering the display sub-pixel 103-1 is increased, indicating that the light transmittance of the display sub-pixel is reduced.

By controlling the light transmittance of the display sub-pixel in each display unit in such a way, the display panel can be allowed to display an image as desired.

When the micro-electromechanical optical valve moves over the display sub-pixel and the solar cell to expose the solar cell, the solar cell can receive the sunlight radiation to perform photoelectric transformation.

In an embodiment, the array substrate is driven by electric energy obtained through photoelectric transformation from the sunlight received by the solar cells.

In yet another embodiment there is provided a window comprising the aforesaid display panel, which performs display when display is needed, and exhibits good effect of not allowing light to transmit when not needed.

The aforesaid description only relates to preferable embodiments of the disclosure and the principle as applied. Those skilled in the art should appreciate that the disclosure is not limited to the particular embodiment described herein. It is apparent for those skilled in the art that various modifications, adjustments and replacements may be made without going beyond the protection scope of the disclosure. Accordingly, although the disclosure has been given a relatively detailed description, the disclosure is not limited to the aforesaid embodiments, but instead may encompass more other equivalent embodiments without going beyond the spirit of the disclosure. The protection scope of the disclosure is defined by the appended claims.

What is claimed is:

1. A display panel comprising:
   an array substrate; and
   a plurality of display units disposed on the array substrate, wherein each display unit comprises:
   a display sub-pixel, configured to receive sunlight radiation and to perform display,
   a solar cell, disposed adjacent to the display sub-pixel and configured to receive sunlight radiation and to perform photoelectric transformation,
   a micro-electromechanical optical valve, disposed above and movable over the display sub-pixel and the solar cell and configured to control a light transmittance of the display sub-pixel so as to control the display sub-pixel to perform display or control the solar cell to receive sunlight radiation and charge the display panel, and
   a blocking structure, disposed at an edge of the display unit and configured to limit the movement of the micro-electromechanical optical valve within the display unit.

2. The display panel according to claim 1, wherein the micro-electromechanical optical valve is connected with the array substrate, and the array substrate controls the movement of the micro-electromechanical optical valve over the display sub-pixel and the solar cell.

3. The display panel according to claim 2, wherein the micro-electromechanical optical valve has an area equal to or greater than that of the display sub-pixel.

4. The display panel according to claim 2, wherein the micro-electromechanical optical valve has an area equal to or less than that of the solar cell.

5. The display panel according to claim 2, wherein areas of the micro-electromechanical optical valve, the display sub-pixel and the solar cell are equal to each other.

6. The display panel according to claim 1, wherein the solar cell receives sunlight radiation to perform photoelectric transformation when the micro-electromechanical optical valve is moved over the display sub-pixel and the solar cell to expose the solar cell.

7. The display panel according to claim 6, wherein the array substrate is connected with the solar cell, and is driven by electric energy obtained through photoelectric transformation from the sunlight received by the solar cell.

8. The display panel according to claim 6, wherein the micro-electromechanical optical valve has an area equal to or greater than that of the display sub-pixel.

9. The display panel according to claim 1, wherein the solar cell comprises a PN junction.

10. The display panel according to claim 1, wherein the display sub-pixels comprise one or more of red pixels, blue pixels or green pixels.

11. The display panel according to claim 1, wherein the micro-electromechanical optical valve and the solar cell comprise an opaque material.

12. The display panel according to claim 1, wherein the micro-electromechanical optical valve has an area equal to or greater than that of the display sub-pixel.

13. The display panel according to claim 1, wherein the micro-electromechanical optical valve has an area equal to or less than that of the solar cell.

14. The display panel according to claim 1, wherein areas of the micro-electromechanical optical valve, the display sub-pixel and the solar cell are equal to each other.

15. A method for controlling the display panel according to claim 1, comprising:
   controlling movement of the micro-electromechanical optical valve of each of the display units over the solar cell and the display sub-pixel to control the light transmittance of the display sub-pixel receiving sunlight radiation to perform display,
   wherein the blocking structure limits the movement of the micro-electromechanical optical valve within the display unit.

16. The method according to claim 15, wherein the array substrate is used to control the movement of the micro-electromechanical optical valve over the display sub-pixel and the solar cell.

17. The method according to claim 16, wherein the solar cell receives sunlight radiation to perform photoelectric transformation when the micro-electromechanical optical valve is moved over the display sub-pixel and the solar cell to expose the solar cell.

18. The method according to claim 15, wherein the solar cell receives sunlight radiation to perform photoelectric transformation when the micro-electromechanical optical valve is moved over the display sub-pixel and the solar cell to expose the solar cell.

19. The method according to claim 18, wherein the array substrate is driven by electric energy obtained through photoelectric transformation from the sunlight received by the solar cell.

20. A window comprising the display panel according to claim 1.

* * * * *